United States Patent [19]

Brenner et al.

[11] Patent Number: 5,097,264
[45] Date of Patent: Mar. 17, 1992

[54] ANALOG-TO-DIGITAL CONVERTER

[75] Inventors: Mats A. Brenner, Bloomington, Minn.; Rudolf C. Dankwort, Phoenix; Tamim F. El-Wailly, Peoria, both of Ariz.

[73] Assignee: Honeywell Inc., Minneapolis, Minn.

[21] Appl. No.: 539,767

[22] Filed: Jun. 18, 1990

[51] Int. Cl.[5] .......................... H03M 1/52; H03M 1/18
[52] U.S. Cl. ..................................... 341/167; 341/139
[58] Field of Search ............... 341/166, 167, 168, 169, 341/170, 118, 155, 164, 165, 128, 129, 139

[56] References Cited

U.S. PATENT DOCUMENTS

| | | | |
|---|---|---|---|
| 3,582,777 | 6/1971 | Wunderman | 341/167 X |
| 3,713,136 | 1/1973 | Nagy, Jr. | 341/167 X |
| 3,896,431 | 7/1975 | Dickinson | 341/128 X |
| 4,031,533 | 6/1977 | Neumann | 341/167 |
| 4,361,831 | 11/1982 | Grutzediek et al. | 341/168 X |
| 4,584,566 | 4/1986 | Arcara | 341/128 |
| 4,588,983 | 5/1986 | Strong | 341/167 |
| 4,851,843 | 7/1989 | Neal | 341/168 X |

*Primary Examiner*—A. D. Pellinen
*Assistant Examiner*—Sharon D. Logan
*Attorney, Agent, or Firm*—Robert A. Pajak

[57] ABSTRACT

An integrating analog-to-digital converter system in which alternating and different combinations of signals are integrated, and which are selected for such integration both periodically and through an integrating result reaching a reference value in the periods. A digit count is provided as a system output indicating the time duration of integration of a selected signal combination in each period.

26 Claims, 2 Drawing Sheets

ANALOG-TO-DIGITAL CONVERTER

BACKGROUND OF THE INVENTION

The present invention relates to analog-to-digital converters and, more particularly, to integrating analog-to-digital converters.

Analog signals generated by various devices such as sensors are very often desired to be converted into corresponding digital signals because of the convenience and accuracy of digital signal processing. Analog-to-digital converters are used to provide sequences of digital code representations of numbers in a chosen number base such that the numbers correspond to the amplitude value of points in, or parts of, an analog signal input waveform provided with respect to some reference value. In other words, the digital code representations of a sequence of numbers is related to the magnitudes of a corresponding sequence of selected points in, or to the magnitudes of the averages of some sort found for each of a corresponding sequence of selected parts of, such an analog input signal with respect to the magnitude of a reference level.

Such analog-to-digital converters compare such magnitudes occurring in an analog input signal at selected times to a conversion reference level magnitude in an attempt to provide an approximation of this relationship, as it occurs in a short sampling time interval or over an averaging duration, by a digital code representation. This process is usually repeated periodically to give a sequence of digital code representations corresponding to sample points or parts in this analog input waveform. The conversion process may be expressed by the analog input signal magnitude, or ratio of signal and reference magnitudes, being taken equal to the product of the conversion reference level magnitude, the output "estimating number" that is represented by the digital code representation, and a "transfer function parameter" which is just equal to one for direct linear converters. However, several possibilities in a converter can permit variances to occur which result in a conversion process leading to a non-linear converter if the design of the converter is not carefully managed. In addition, the transfer function may be intended to perform a mathematical process such as integration so that the output digital code representations represent the integral of the analog input signal.

Another source of difficulty in the conversion process is the presence of noise superimposed on the analog input signal to be converted to a sequence of digital code representations. Since a direct conversion process, as previously described, provides a digital code representation for each corresponding selected sample point in the analog input signal, and so depends on the value of that input signal at the exact point in time when the sample is taken, the output code sequence will usually differ from what it otherwise would have been in the absence of noise superimposed on the analog signal. Although such noise could be removed to a considerable extent by preliminary analog filtering or subsequent digital processing, there can be substantial value in eliminating any effect of the noise before the conversion is complete. Typically, this is done by using an analog-to-digital conversion technique in which the digital code presentation depends on the time integral, or average value, of the analog input signal during some time interval about each point where a conversion is desired. Such integration, or averaging, of the signal sample leads to being able to give very repeatable results for the same analog waveform even in the presence of substantial amounts of noise occurring in connection with that signal. The effects of noise will be averaged out for those noise frequencies present within the analog input signal which have the reciprocal values thereof that are less than the time of integration of the analog input signal about a sampling point.

The time interval of such integration, if done discretely for each sample part, must be small enough to insure that there will be a sequence of digital code representations at a rate sufficient to successfully simulate the analog input signal without any aliasing thereof. On the other hand, the time interval should be as large as possible under this constraint to the extent possible so as to maximize the duration of signal averaging for each point which will in turn minimize the noise induced errors in the output digital code representations.

In some situations, there is the need to have an average value of the input analog signal, averaged over many sampling times thereof, be very accurately provided at the output of the converter, and that accuracy must be maintained as precisely as the accuracy of the average value determined over one or a few sample periods. That is, the errors in each sample must not accumulate over many such samples. One such situation is the use of rate gyroscopes in aircraft to provide attitude and heading reference signals. In such systems, the precision of the angular rate measurement must be on the order of one or two tenths parts per million, which requires the analog-to-digital converter to be able to provide output signals of 24-bit precision if that accuracy is to be maintained. This requirement can be eased somewhat if a selectable gain amplifier is used ahead of the analog-to-digital converter to effectively compress the range of the analog input signal. However, the gain changing range for such an amplifier is often limited to a 10:1 range, and this results in still requiring a 22-bit precision in the analog-to-digital converter output signal.

Integrating analog-to-digital converters can meet this requirement since they produce very accurate conversions. This occurs because of the averaging of the input signal over selected times through integration and, preferably, the integration would be done continuously to effectively eliminate the repeated sampling aspect of the conversion process and therefore eliminate any constraint on the lowest frequency signal which can be converted.

On the other hand, integrating analog-to-digital converters in many forms thereof are deficient in responding to rapidly changing inputs because of the very integration process which is used to provide accuracy. Performing the integration, or the averaging process, over time results in a delay in providing correct digital signal outputs due to the time taken for convergence of the conversion process, and yet the longer the time taken for those operations the more accurate the conversion performed. Thus, there is desired an integrating analog-to-digital converter which can provide an exact conversion periodically at a fast rate during the conversion process but which retains the integration process for the input analog signal to result in an accurate conversion.

SUMMARY OF THE INVENTION

The present invention provides an integrating analog-to-digital converter system operated by alternatively integrating different combinations of signals, which are alternatively selected therefor both periodically and through an integration result reaching a reference value in the periods, there being a digital count provided as an output of the time duration of integration of a selected combination in each period. A first signal combination based on an analog input signal and a reference value signal is integrated by an integrator for a part of each successive period until the integrated result reaches a reference value determined by a comparator connected to the integrator, and then a second signal combination is integrated by that integrator for a selected time in each period based on the time remaining in that period where the second signal combination is different but also based on the analog input signal and the reference value signal. A count is provided by a counting means representative of the time duration taken for each integration of one of the signal combinations in each of these periods, and a time integral is calculated over a selected time duration based on such counts and on constants determined by component relationships in the conversion system.

DETAILED DESCRIPTION OF THE PREFERRED EMBODIMENTS

Figure 1:
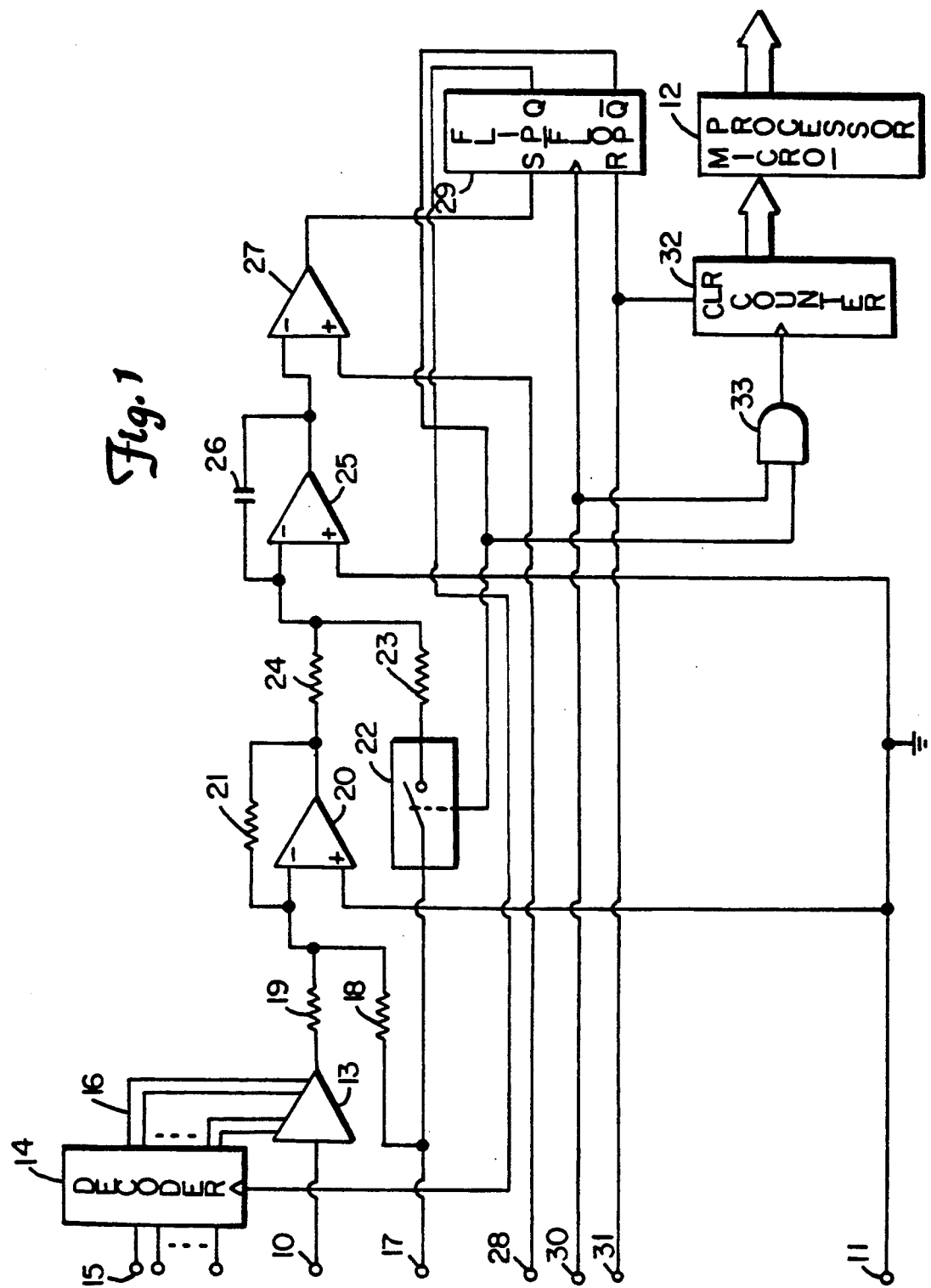
FIG. 1 shows a block and circuit schematic diagram of a system embodying the present invention.

FIG. 1 shows a block and circuit schematic diagram of the integrating analog-to-digital converter system embodying the present invention although excluding those system portions for developing certain timing signals and reference signals. In addition, the signal source of the analog input signal to be converted to a digital code representation is not shown in FIG. 1, nor are the system portions which make use of the digital signal outputs of the converter system. Further, certain commands or signals are provided for operating the system of FIG. 1 from sources which are also not shown in that figure. Finally, supply voltages for operating power to the various components of the system of FIG. 1 are also not shown.

An analog input signal in the form of a voltage waveform is assumed to be provided between a system analog signal input, 10, and a further terminal, 11, at which the system ground reference voltage is provided. The analog-to-digital converter system output digital representation codes will be provided as a plurality of digit signals, each representing a digit or code symbol place in the code, by a microprocessor, 12.

Analog input signal terminal 10, which will be some region in a monolithic integrated circuit in a typical embodiment, is connected to the input of a variable gain amplifier, 13. The gain of variable gain amplifier 13 is set by digital signals supplied thereto from a decoder, 14, which has a plurality of inputs, 15, and a plurality of outputs, 116. Output signals 16 from decoder 14 are supplied as inputs to variable gain amplifier 13 so that codes provided at decoder input 15 can select the gain of amplifier 13. Variable gain amplifier 13 allows effective compression of input signals provided to analog input signal terminal 10 to reduce the analog input signal range which remaining portions of the system of FIG. 1 are required to convert to corresponding digital representation codes.

A reference signal is supplied to a further input terminal, 17, which signal can be used to indicate conditions in the system portions ahead of analog input signal terminal 10 as a basis for compensation of unwanted variations in the analog input signal supplied to terminal 10. These might be, for instance, changes in conditions at a sensor serving as a source of such the analog input signal. This reference signal supplied at terminal 17 is supplied through a resistor, 18, to a circuit junction node to which the output signal of variable gain amplifier 13 is also supplied through another resistor, 19. This circuit junction node also has connected thereto the inverting input of an operational amplifier, 20, and a feedback resistor, 21, connected between the output of operational amplifier 20 and that node.

Operational amplifier 20 and resistors 18, 19 and 21 together form a signal combining circuit such that the output signal of operational amplifier 20 is provided as a weighted combination of the output signal of variable gain amplifier 13 and the reference signal provided on input terminal 17. If the signal voltage at the output of variable gain amplifier 13 is designated $v_{13}$, and the reference voltage at input terminal 17 is negative and designated $-v_{17}$, the voltage signal at the output of operational amplifier 20 designated as $v_{20}$ can be written as follows:

$$v_{20} = \frac{R_{21} v_{17}}{R_{18}} - \frac{R_{21} v_{13}}{R_{19}}$$

In the foregoing expression, the designations $R_{18}$, $R_{19}$ and $R_{21}$ represent the resistance values of resistors 18, 19 and 21, respectively. Typical values are 10.0 kΩ for $R_{18}$, 30.0 kΩ for $R_{19}$, and 7.5 kΩ for $R_{21}$.

Input terminal 17 is also connected to a switch arrangement, 22, so that reference voltage $v_{17}$ can also be supplied to the next stage in the converter system of FIG. 1 following the signal combiner based on operational amplifier 20. Switch 22 is formed by an analog transmission gate of a well known type. If switch 22 is closed, voltage $v_{17}$ is supplied through a resistor, 23, to another circuit junction node to which voltage $v_{20}$ from the output of operational amplifier 20 is also supplied through a further resistor, 24. Further connected to this second circuit junction node is an inverting input of a further operational amplifier, 25, and one side of a capacitor, 26, connected between the output of operational amplifier 25 and that node to thereby serve as an integrator. Hence, if switch 22 is open, only voltage output signal $v_{20}$ is supplied to this circuit junction node of this integration stage, otherwise both signals $v_{20}$ and $v_{17}$ are supplied thereto.

This arrangement involving operational amplifier 25 thus forms not only an integrator but a summing integrator. Thus, if switch 22 is open, the output voltage at the output of amplifier 25, designated $v_{25}$ in the absence of any initial charge on capacitor 26, can be written as:

$$v_{25_o} = -\frac{1}{R_{24} C_{26}} \int v_{20} dt = \frac{1}{R_{24} C_{26}} \int \left( \frac{R_{21} v_{13}}{R_{19}} - \frac{R_{21} v_{17}}{R_{18}} \right) dt$$

where $R_{24}$ and $C_{26}$ represent the resistance and capacitance values of resistor 24 and capacitor 26, respectively. A typical value for $R_{24}$ would be 50.0 kΩ and for $C_{26}$ such a value would be 0.1 μf. The modified output voltage designation $v_{25o}$ in this equation represents the output voltage signal of operational amplifier 25 with switch arrangement 22 being open. This voltage will be decreasing if negative reference voltage $v_{17}$ is of a magnitude sufficiently greater than that of output voltage $v_{13}$ of variable gain amplifier 13.

If, on the other hand, switch arrangement 22 is closed, the output voltage of output amplifier 25 is designated $v_{25c}$ and can be written in the absence of any initial charge on capacitor 26 as $$v_{25c} = \int \left( \frac{v_{17}}{R_{23}C_{26}} - \frac{v_{20}}{R_{24}C_{26}} \right) dt$$

$$= \int \left[ \frac{v_{17}}{R_{23}C_{26}} - \frac{1}{R_{24}C_{26}} \left( \frac{R_{21}v_{17}}{R_{18}} - \frac{R_{21}v_{13}}{R_{19}} \right) \right] dt$$

with $R_{23}$ representing the resistance value of resistor 23 which would typically be 50.0 kΩ. This output voltage will rise if the magnitude of $v_{17}$ is sufficiently greater than that of $v_{13}$.

The output of operational amplifier 25 is directly connected to the inverting input of a further amplifier, 27, serving as a comparator. The non-inverting input of comparator 27 is connected to a further input terminal, 28, at which another reference voltage is supplied, typically a negative voltage held at a constant value and designated $-V_{28}$.

Thus, if switch arrangement 22 is open, output voltage signal $v_{25o}$ will continue decreasing (assuming that the magnitude of $v_{17}$ is greater than that of $v_{13}$) until it reaches the value $-V_{28}$. At that point, the voltage output of comparator 27 will switch from a low voltage level representing a logic state "0" to a high voltage state representing a logic state "1", this output of comparator 27 being connected to the S input of a SR flip-flop, 29, to receive this logic state change.

Flip-flop 29 has its clock input supplied from a further input terminal, 30, which is intended to receive a clocking signal of a relatively high frequency in the form of a rectangular wave of frequency $f_c$ with a 50% duty cycle, the frequency $f_c$ typically being 256 kHz. Flip-flop 29 is a positive edge triggered type of flip-flop so that logic state changes on its S and R inputs become effective at the outputs Q and $\overline{Q}$ after the next rising clock edge at input terminal 30 following any such changes at inputs S and R.

Input R of flip-flop 29 receives a further clocking signal supplied to another input terminal, 31, with this signal being of a relatively low frequency. A typical frequency would be 64 Hz, and this low frequency signal typically has a rectangular waveform exhibiting a very short duty cycle so that the waveform appears as a short duration pulse repeating at this low frequency. This same low frequency signal is also applied to the clear input of an up counter, 32, to have the effect of periodically clearing any previous count accumulation occurring therein.

In operation, each pulse in the low frequency clocking signal provided at input 31 leads to resetting flip-flop 29 upon the next rising edge of the high frequency clocking signal on input 30. This results in a "0" logic state at output Q of flip-flop 29, and so a "1" logic state at output $\overline{Q}$ which causes switch arrangement 22 to open. As a result, the situation described above occurs with output signal $v_{25o}$ of integrator operational amplifier 25 decreasing until reaching voltage value $-V_{28}$. At the same time, the "1" logic state at output $\overline{Q}$ of flip-flop 29 is applied to one side of a logic gate, 33, which has its other input connected to high frequency clocking signal terminal 30. The output of logic gate 33 is connected to the clock input of counter 32 so that pulses therefrom are counted in counter 32. Thus, counter 32 is first cleared by, the rising edge of each pulse in the low frequency clocking signal on input 31, and immediately thereafter begins accumulating counts of rising edges in the high frequency clocking signal provided at input 30 at frequency $f_c$ as permitted by output $\overline{Q}$ of flip-flop 29 going to the "1" logic state.

Upon the change described above occurring in logic state present at the output of comparator 27, due to output voltage signal $v_{25c}$ of integrator operational amplifier 25 reaching $-V_{28}$ and switching the logic state at the output of comparator 27, flip-flop 29 will on the next rising edge of the high frequency clock signal on input terminal 30 provide a "1" logic state at its output Q and so a "0" logic state at its output $\overline{Q}$. This causes the closure of switching arrangement 22 and the blocking by logic gate 33 of any rising edges in the high frequency clocking signal on input 30 from being passed through to counter 32 to be counted and accumulated in the count total therein.

The closure of switching arrangement 22 causes the output signal of integrator operational amplifier 25 to become $v_{25c}$ which, as indicated above, increases for negative reference voltage $v_{17}$ being of a magnitude sufficiently greater than that of variable gain amplifier output voltage $v_{13}$. Thus, upon this increase in integrator output voltage occurring, the output of comparator 27 is forced back to a "0" logic state and the voltage at the output of integrator operational amplifier 25 continues to rise until the next pulse in the low frequency clocking signal on input terminal 31 occurs. This occurrence, followed by the next rising edge thereafter of the high frequency clocking signal on input terminal 30, resets flip-flop 29 to result in the opening of switching arrangement 22.

This opening and closing of switch arrangement 22 occurs once in each period of the low frequency clock signal provided on input 31 of the system in FIG. 1, and so forms a sequence of pairs each comprising an opening and a corresponding closing of that switch. During the time that switch 22 is opened in each of these periods, a count will accumulate in previously cleared counter 32, and the subsequent closure of switch 22 will stop a further count accumulation in counter 32 during that period thus providing time for transmitting the accumulated count in that period to microprocessor 12.

As will be shown below, microprocessor 12 can, with such information, supply a set of digit output signals at its outputs in each period to thereby provide a digital representation code of a value representing the average value of the ratio of the input analog signal voltage after its amplification by variable gain amplifier 13 to the reference voltage applied at input terminal 17 over a time duration lasting at least on the order of a period or so. Such a set of digit signals can be generated in each period to provide a current digital representation code for that period even though a change in such an input signal-reference signal voltage ratio to a new value will not lead to a steady state in the integrator until a large number of such periods have elapsed after that change in the value of that ratio. In such a steady state, there is uniform charging and discharging of capacitance 26 in the integrator such that there is no net charge thereacross in each low frequency clock signal period.

Figure 2:
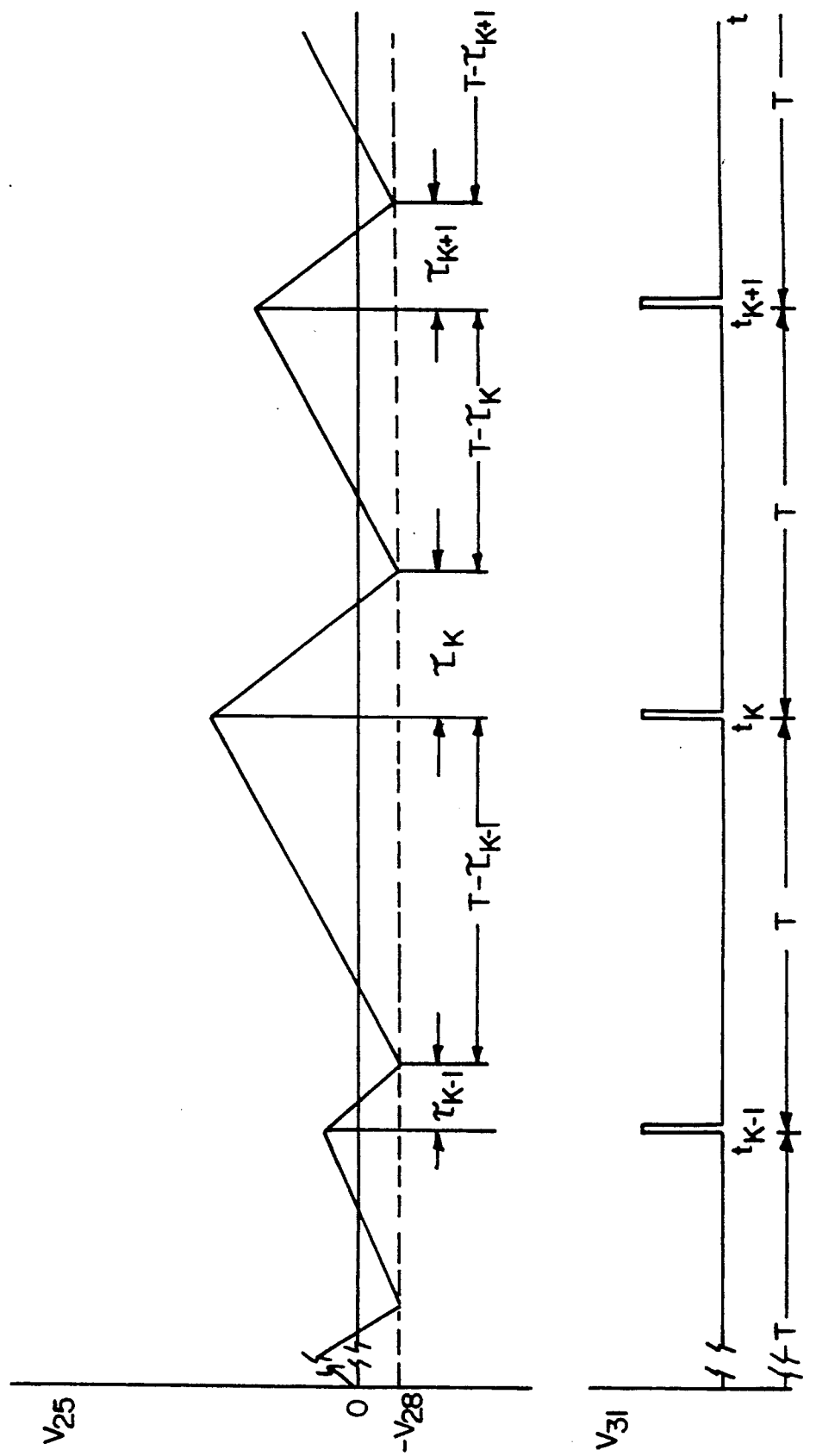
FIG. 2 shows waveforms of signals which typically occur in the system of FIG. 1.

Typical waveforms of the periodic low frequency clock signal, $v_{31}$, having a period T, and the output voltage $v_{25}$ of integrator operational amplifier 25 are shown in FIG. 2. The waveform for output voltage $v_{25}$ of integrator operational amplifier 25 is shown in a non-steady state condition. In a steady state condition, the positive peaks would equal one another indicating that there is no net charge on integrator capacitance 26 in each period T of the low frequency clock signal voltage $v_{31}$. Output voltage $v_{25}$ of integrator operational amplifier 25 comprises alternating segments of $v_{25o}$ and $v_{25c}$. Decreasing slope segments as described above represent the value of $v_{25o}$ over those times in which they occur, and increasing slope segments represent the values of $v_{25c}$ over the times over in which they occur. Linear slopes are shown on the assumption that substantial changes are not occurring in the input signal-reference signal voltage ratio during a period T of the low frequency input signal but, even so, the slopes would still have the same sign although they may vary during a time span in which any one of them occurs due to changing values of the ratio.

For FIG. 2, a sequence of discrete time points, $t_n$, has been defined each at a succeeding rising edge of the low frequency clock signal applied to input terminal 31 as represented by voltage $v_{31}$ in the lower graph of FIG. 2. Three particular discrete time points, or values of $t_n$, have been shown in the graph for $v_{31}$, these being $t_{k-1}$, $t_k$ and $t_{k+1}$. At each of discrete time points $t_n$, or about at each of the rising edges of the low frequency clock signal voltage $v_{31}$, switch arrangement 22 is caused to open so that immediately thereafter the output voltage of integrator operational amplifier 25 is represented by $v_{25o}$ with values corresponding to the $t_n$ of interest. However, preceding any such discrete time point $t_n$, the voltage at the output of integrator operational amplifier 25 is represented by $v_{25c}$. Since the voltage in such times that immediately precede any $t_n$ always rises from $-V_{28}$ to equal some corresponding value of $v_{25c}$ reached at the corresponding $t_n$, and so at each of discrete time points $t_{k-1}$, $t_k$ and $t_{k+1}$, and further, since the voltage $v_{25o}$ following each corresponding $t_n$ will fall from that value reached by the preceding $v_{25c}$ to a value equal to $-V_{28}$ after each of these corresponding time points in a varying duration $\tau_n$, these integrator output voltage changes on either side of any such discrete time point $t_n$ must equal one another. Thus, the following equality results:

$$v_{25c}|_{t_n} - V_{28} = v_{25o}|_{t_n} - V_{28}$$

These voltage change values in each discrete time point instance represent integrals over different time portions as shown in the two equations preceding the last equation. Thus, such equations can be set equal to one another as in the last equation if the integrals therein are taken over the corresponding times on either side of any discrete time point $t_n$ of interest. The result is:

$$v_{25c}|_{t_n} - V_{28}$$

-continued $$= \int_{t_{n-1} + \tau_{n-1}}^{t_n} \left[ \frac{v_{17}}{R_{23}C_{26}} - \frac{1}{R_{24}C_{26}} \left( \frac{R_{21}v_{17}}{R_{18}} - \frac{R_{21}v_{13}}{R_{19}} \right) \right] dt$$

$$= \frac{1}{R_{24}C_{26}} \int_{t_n}^{t_n + \tau_n} \left( \frac{R_{21}v_{13}}{R_{19}} - \frac{R_{21}v_{17}}{R_{18}} \right) dt = v_{25o} \bigg|_{t_n} - V_{28}$$

The equal integrals on either side of this last equation can be simplified if the ratio $$\frac{\frac{R_{19}R_{24}C_{26}}{v_{17}R_{21}}}{\frac{R_{19}R_{24}C_{26}}{v_{17}R_{21}}} = 1$$

is introduced under the integrals on either side of the equation to give the following result:

$$\int_{t_{n-1} + \tau_{n-1}}^{t_n} \frac{1}{\frac{R_{19}R_{24}C_{26}}{v_{17}R_{21}}} \left( \frac{R_{19}R_{24}}{R_{23}R_{21}} - \frac{R_{19}}{R_{18}} + \frac{v_{13}}{v_{17}} \right) dt =$$

$$\int_{t_n}^{t_n + \tau_n} \frac{1}{\frac{R_{19}R_{24}C_{26}}{v_{17}R_{21}}} \left( \frac{R_{19}}{R_{18}} - \frac{v_{13}}{v_{17}} \right) dt$$

These integrals can be further simplified by assuming that the value of the reference voltage $v_{17}$ will be essentially constant over time durations on the order of a period of the low frequency clock signal applied to input 31. This is a reasonable assumption as the reference voltage is typically used primarily to compensate for long term changes in the signal sources ahead of input 10 of the converter system of FIG. 1, such as temperature shifts or component aging in a sensor signal source. If this assumption is made, the factor to the left of the parentheses in each of the integrals can be brought out from under the integrals and they cancel one another since they are equal. A further simplification can be made through defining the following constants:

$$a \triangleq \frac{R_{19}}{R_{18}} \; ; \; b \triangleq \frac{R_{19}R_{24}}{R_{21}R_{23}} - \frac{R_{19}}{R_{18}}$$

With these simplifications, the equal integrals become the following:

$$\int_{t_{n-1} + \tau_{n-1}}^{t_n} \left( b + \frac{v_{13}}{v_{17}} \right) dt = \int_{t_n}^{t_n + \tau_n} \left( a - \frac{v_{13}}{v_{17}} \right) dt$$

Performing integrations of the constant terms in the integrals on either side of the last equation gives the following further result:

$$\int_{t_{n-1} + \tau_{n-1}}^{t_n} \frac{v_{13}}{v_{17}} dt + bt_n - bt_{n-1} - b\tau_{n-1} =$$

$$\int_{t_n}^{t_n + \tau_n} \frac{v_{13}}{v_{17}} dt + at_n + a\tau_n - at_n$$

Some algebraic transposition, combining the remaining integrals to be a single integral over a combined range of integration, and recognizing that $t_n - t_{n-1} = T$, gives the following equality between the integral of the ratio of the output signal of variable gain amplifier 13 and the reference signal supplied at input 17 in terms of the two defined constants and some corresponding time durations:

$$\int_{t_{n-1} + \tau_{n-1}}^{t_n + \tau_n} \frac{v_{13}}{v_{17}} dt = a\tau_n + b\tau_{n-1} - bT$$

The period T of the low frequency clocking signal applied on input 31 to provide voltage $v_{31}$ is assumed to be accurately known as stable periodicity in a clocking signal can be provided in a well known manner. The time durations $\tau_n$ and $\tau_{n-1}$ are obtained from the counts accumulated in counter 32 at the beginning of the periods $t_n$ and $t_{n-1}$, respectively. Thus, these values are $$\tau_{n-1} = \frac{N_{n-1}}{f_c} ; \tau_n = \frac{N_n}{f_c}$$

where $N_{n-1}$ is the count total which is accumulated in counter 32 in the low frequency clock period beginning with discrete time point $t_{n-1}$, and $N_n$ is the count total accumulated in counter 32 in the low frequency clock period beginning with discrete time point $t_n$. As can be seen, the average of this ratio is provided by the constants and the times closely associated with the times over which the integration is performed; hence there is no delay in providing an accurate value for this ratio even though it may take a large number of periods of the low frequency clock signal before a steady state is reached in the conversion system based on the charging and discharging of capacitance 26 in the integrator.

Any changing of the gain of variable gain amplifier 13 must be done synchronously with the averaging period $t_{n-1} + \tau_{n-1}$ to $t_n + \tau_n$ if each count accumulated in counter 32 in one of the periods of the low frequency clocking signal is to be uniquely associated with a given gain setting of amplifier 13. This is conveniently accomplished by permitting gain changes in variable gain amplifier 13 only at times at which flip-flop 29 changes output states in one direction, this being from reset to set. Thus, decoder 14 has its clock input connected to output Q of flip-flop 29.

These last two equations can be combined with the expression on the right in the equation preceding them to show how the value of the integral on the left can be obtained in that equation by microprocessor 12 from count totals in successive periods of the low frequency clocking signal on input terminal 31 represented by $v_{31}$. This combining gives $$\int_{t_{n-1} + \tau_{n-1}}^{t_n + \tau_n} \frac{v_{13}}{v_{17}} dt = a\frac{N_n}{f_c} + b\frac{N_{n-1}}{f_c} - bT$$

The calculation on the right in the preceding equation is easily carried out by microprocessor 12, even a microprocessor of quite modest capabilities, to evaluate the integral of the ratio of the output voltage $v_{13}$ of variable gain amplifier 13 to the reference voltage $v_{17}$. The average value of this ratio over the time duration of integration occurring in this last equation can easily be found by dividing both sides of this last equation by that time duration, this time duration being found by subtracting the time at which the integration begins, $t_{n-1} + \tau_{n-1}$, from the time at which the integration ends, $t_n + \tau_n$, to give the result $T + \tau_n - \tau_{n-1}$. This last time duration can be converted by the two equations preceding the last for the division on the right to keep it in terms that are usable by microprocessor 12 resulting in the following:

$$\frac{\int_{t_{n-1} + \tau_{n-1}}^{t_n + \tau_n} \frac{v_{13}}{v_{17}} dt}{T + \tau_n - \tau_{n-1}} = \frac{a\frac{N_n}{f_c} + b\frac{N_{n-1}}{f_c} - bT}{T + \frac{N_n}{f_c} - \frac{N_{n-1}}{f_c}}$$

The expression on the right in this last equation can again be easily evaluated by a microprocessor having any significant calculating capability and chosen to serve as microprocessor 12.

The steady state behavior of the converter system comes about when the ratio of the output voltage $v_{13}$ of variable gain amplifier 13 to reference voltage $v_{17}$ becomes and remains constant for a significant time. Once this condition is established, the voltage peaks of the output voltage $v_{25}$ of integrator operational amplifier 25 will all become equal since the charge and discharge of integrator capacitance 26 will leave no net charge thereon in each cycle of such charging and discharging. Further, the times $\tau_n$ will all become equal so that $\tau_{k-1}$, $\tau_k$ and $\tau_{k+1}$ of FIG. 2 will equal one another, i.e. $\tau_n = \tau_{nSS}$ and, equivalently, all of the counts $N_n = N_{nSS}$. In this steady state situation, the integral for the input signal-reference signal voltage ratio can be easily evaluated by taking the ratio outside of the integral sign and performing the integration yielding a result equal to the value T, the period of the low frequency clock signal $v_{31}$. Thus, the value of this integral in the steady state condition can be obtained for the equation preceding the last as $$\int_{t_{n-1} + \tau_{n-1}}^{t_n + \tau_n} \frac{v_{13}}{v_{17}} dt \bigg|_{ss} = \frac{v_{13}}{v_{17}} T = \frac{N_{nss}}{f_c} (a + b) - bT$$

The average value of this signal voltage ratio can then be found by dividing this last equation on both sides by the period T, or by evaluating the equation preceding it in the same manner to give $$\frac{v_{13}}{v_{17}} = \frac{N_{nss}}{Tf_c} (a + b) - b$$

The results provided by counter 32 to microprocessor 12, however, do not limit microprocessor 12 to providing integral values of the signal voltage ratio or averages thereof over just the time durations appearing in the foregoing equations. That is, there is nothing to prevent tacking on integrations for additional such time periods end-to-end to provide the value of the integral of the ratio of the output voltage $v_{13}$ of variable gain amplifier 13 to the reference voltage $v_{17}$ over any arbitrarily large time period of selected duration D. Thus, repeated use of the equation for the integral of this ratio for a time duration $t_{n-1} + \tau_{n-1}$ to $t_n + \tau_n$ over such a duration beginning at zero yields the following:

$$\int_o^D \frac{v_{13}}{v_{17}} dt = \int_{\tau_o}^{t_1 + \tau_1} \frac{v_{13}}{v_{17}} dt + \ldots +$$

$$\int_{t_{ND-1} + \tau_{ND-1}}^{t_{ND} + \tau_{ND}} \frac{v_{13}}{v_{17}} dt =$$

$$\sum_{n=1}^{N_D} \left( a \frac{N_n}{f_c} + b \frac{N_{n-1}}{f_c} - bT \right) =$$

$$(a + b) \sum_{n=1}^{N_D - 1} \frac{N_n}{f_c} + a \frac{N_D}{f_c} + b \frac{N_O}{f_c} - N_D bT$$

Here, the time duration D is expressed $$D = \sum_{n=1}^{N_D} (T + \tau_n - \tau_{n-1}) = \sum_{n=1}^{N_D} \left( T + \frac{N_n}{f_c} - \frac{N_{n-1}}{f_c} \right) =$$

$$N_D T + \frac{N_D}{f_c} - \frac{N_o}{f_c}$$

Although the present invention has been described with reference to preferred embodiments, workers skilled in the art will recognize that changes may be made in form and detail without departing from the spirit and scope of the invention.

What is claimed is:

1. An integrating analog-to-digital converter system having an analog signal input region suited for receiving an analog input signal to be converted into converter system digital output signals and which is operated by selecting for integration alternative combinations of signals involving a version of said analog input signal with such selections being made both by periodic change, as initiated with a periodic timing signal of a repeated selected period extending over a series of such periods, and by integration results reaching a reference value in such periods, said converter system having a clock signal input region suited for receiving said periodic timing signal and a reference signal input region suited for receiving a reference value signal, said converter system having a plurality of signal output regions each for providing a digit signal of a selected value to thereby provide said digital output signals which are based on times of integration of said combinations of signals in said periods, said converter system comprising:

a signal combining means having an output and having a plurality of inputs one of which is electrically connected to said analog signal input region and another of which is electrically connected to said reference signal input region, said signal combining means being capable of providing an output signal based on signals provided at said analog signal input region and said reference signal input region effectively multiplied by corresponding selected ratios;

an integrating means having an output and a plurality of inputs, said integrating means being capable of providing an output signal that is a time integral of signals supplied to a said input thereof, said integrating means having a said input thereof electrically connected to said signal combining means output;

a comparator means having an output and having an input, said comparator means being capable of providing a first voltage state at said output thereof if a voltage applied to said input thereof exceeds a comparator reference value and of providing a second voltage state at said output thereof if a voltage applied to said input thereof is less than said comparator reference value, said comparator means input being electrically connected to said integrating means output; and a switching means having a plurality of inputs and being electrically connected to be capable of selectively connecting and disconnecting said reference signal input region from an input of said integrating means, said clocking signal input region being electrically connected to a said switching means input and said comparator means output being electrically connected to a said switching means input.

2. The apparatus of claim 1 wherein said input of said integrating means to which said signal combining means output is electrically connected, as aforesaid, and said input of said integrating means which is selectively connected and disconnected from said reference signal input region by said switching means, as aforesaid, are each electrically connected to a common circuit point in said integrating means.

3. The apparatus of claim 2 wherein said inputs of said integrating means which are electrically connected to said common circuit point are each so connected thereto through a corresponding resistive means.

4. The apparatus of claim 3 wherein said integrating means comprises an operational amplifier having an inverting input electrically connected to said common circuit point, and further comprises a capacitance connected between said integrating means output and said common circuit point.

5. The apparatus of claim 1 wherein said signal combining means input which is electrically connected to said analog signal input region, as aforesaid, is so connected thereto through a variable gain amplifier having a signal input electrically connected to said analog signal input region and an output connected to that said input of said integrating means, said variable gain amplifier having a control input which is electrically connected to a gain control signal input region intended to receive gain control signals to select alternative gains to be applied by said variable gain amplifier to signals provided on said signal input thereof with resulting signals being provided at said output thereof.

6. The apparatus of claim 1 wherein said input of said signal combining means which is electrically connected to said analog signal input region, as aforesaid, and said input of said signal combining means which is electrically connected to said reference signal input region, as aforesaid, are each electrically connected to a common circuit point in said signal combining means.

7. The apparatus of claim 6 wherein said inputs of said signal combining means which are electrically connected to said common circuit point are each so connected thereto through a corresponding resistive means.

8. The apparatus of claim 7 wherein said signal combining means comprises an operational amplifier having an inverting input electrically connected to said common circuit point, and further comprises a resistance connected between said signal combining means output and said common circuit point.

9. The apparatus of claim 1 wherein said converter system has a counting base signal input region intended for receiving a counting base signal and said switching means has an input thereof electrically connected to said counting base signal input region, said switching means further comprising a counting means capable of being cleared before, and counting pulses in said counting base signal during, selected portions of said periods each of which portions is determined in duration both by said periodic timing signal and by a voltage state change at said comparator means output, said counting means providing those counts reached in each of said period portions at an output thereof.

10. The apparatus of claim 9 wherein said switching means further comprises a calculating means which successively receives those counts reached by said counting means in said period portions and provides a plurality of calculating means digital output signals each as a said digit signal to one of said converter system plurality of signal output regions to thereby form said converter system digital output signals representing time integrals of a ratio of said analog input signal to said reference value signal over selected time periods.

11. The apparatus of claim 10 wherein said input of said integrating means to which said signal combining means output is electrically connected, as aforesaid, and said input of said integrating means which is selectively connected and disconnected from said reference signal input region by said switching means, as aforesaid, are each electrically connected to a signal combining common circuit point in said integrating means.

12. The apparatus of claim 11 wherein said input of said signal combining means which is electrically connected to said analog signal input region, as aforesaid, and said input of said signal combining means which is electrically connected to said reference signal input region, as aforesaid, are each electrically connected to a signal combining means common circuit point in said signal combining means.

13. The apparatus of claim 12 wherein said inputs of said integrating means which are electrically connected to said integrating means common circuit point are each so connected thereto through a corresponding resistive means, and wherein said inputs of said signal combining means which are electrically connected to said signal combining means common circuit point are each so connected thereto through a corresponding resistive means.

14. The apparatus of claim 13 wherein values of said time integral over selected times are determined by a correspondingly selected number of said periods contained therein, those counts which are reached in said counting means in each of those said periods so contained, and on ratios of values of resistances in those said resistive means contained in said integrating means and said signal combining means.

15. The apparatus of claim 9 wherein said switching means further comprises a calculating means which successively receives those counts reached by said counting means in said period portions and provides a plurality of calculating means digital output signals each as a said digit signal to one of said converter system plurality of signal output regions to thereby form said converter system digital output signals representing signal averages of a ratio of said analog input signal to said reference value signal over selected time periods.

16. The apparatus of claim 10 wherein said input of said integrating means to which said signal combining means output is electrically connected, as aforesaid, and said input of said integrating means which is selectively connected and disconnected from said reference signal input region by said switching means, as aforesaid, are each electrically connected to an integrating means common circuit point in said integrating means.

17. The apparatus of claim 16 wherein that input of said signal combining means which is electrically connected to said analog signal input region, as aforesaid, and said input of said signal combining means which is electrically connected to said reference signal input region, as aforesaid, are each electrically connected to a signal combining means common circuit point in said signal combining means.

18. The apparatus of claim 17 wherein said inputs of said integrating means which are electrically connected to said integrating means common circuit point are each so connected thereto through a corresponding resistive means, and wherein said inputs of said signal combining means which are electrically connected to said signal combining means common circuit point are each so connected thereto through a corresponding resistive means.

19. The apparatus of claim 18 wherein values of said signal averages over selected times are determined by a correspondingly selected number of said periods contained therein, those counts which are reached in said counting means in each of those said periods so contained, and on ratios of values of resistances in those said resistive means contained in said integrating means and said signal combining means.

20. A method for providing digital output signals in an analog-to-digital conversion to represent a selected version of an analog input signal, said method comprising:
   integrating a first signal combination based on said analog input signal effectively multiplied by a corresponding selected ratio and a reference value signal effectively multiplied by a corresponding selected ratio for a first portion of each period in a succession of periods, delineated by a periodic timing signal, until resulting values of said integrations in each period in said succession thereof each reach a reference value;
   integrating for a selected time during a second portion of each said period in said succession thereof a second signal combination based on said analog input signal and on said reference value signal, said second signal combination differing from said first signal combination;
   providing counts representative of corresponding ones of those time durations taken by corresponding integrations of one of said first and second signal combinations in said periods; and
   calculating a digital equivalent value based on said counts that is substantially equal to a representation of a time integral of a ratio of said analog input signal to said reference value signal over a selected number of periods in said succession thereof.

21. The method of claim 20 wherein each of said first and second signal combinations are formed of weighted values of a ratio of said analog input signal to said reference value signal plus a constant, said calculating of said digital equivalent value being based both on said counts and on representations of said constants.

22. The method of claim 20 wherein said representation of a time integral of a ratio of said analog input signal to said reference value signal over a selected number of periods in said succession thereof is a signal average of said ratio over said selected number of periods.

23. An integrating analog-to-digital converter system having an analog signal input region suited for receiving an analog input signal to be converted into converter system digital output signals and which is operated by selecting for integration alternative combinations of signals involving a version of said analog input signal with such selections being made both by periodic change, as initiated with a periodic timing signal of a repeated selected period extending over a series of such periods, and by integration results reaching a reference value in such periods, said converter system having a clock signal input region suited for receiving said periodic timing signal, a counting base signal input region intended for receiving a counting base signal, and a reference signal input region suited for receiving a reference value signal, said converter system having a plurality of signal output regions each for providing a digit signal of a selected value to thereby provide said digital output signals which are based on times of integration of said combinations of signals in said periods, said converter system comprising:

a single combining means having an output and having a plurality of inputs one of which is electrically connected to said analog signal input region and another of which is electrically connected to said reference signal input region, said signal combining means being capable of providing an output signal based on signals provided at said analog signal input region and said reference signal input region;

an integrating means having an output and a plurality of inputs, said integrating means being capable of providing an output signal that is a time integral of signals supplied to a said input thereof, said integrating means having a said input thereof electrically connected to said signal combining means output;

a comparator means having an output and having an input said comparator means being capable of providing a first voltage state at said output thereof if a voltage applied to said input thereof exceeds a comparator reference value and of providing a second voltage state at said output thereof if a voltage applied to said input thereof is less than said comparator reference value, said comparator means input being electrically connected to said integrating means output; and a switching means having a plurality of inputs and being electrically connected to be capable of selectively connecting and disconnecting said reference signal input region from an input of said integrating means, said clocking signal input region being electrically connected to a said switching means input, said counting base signal input region being electrically connected to a said switching means input, and said comparator means output being electrically connected to a said switching means input, said switching means further comprising a counting means capable o being cleared before, and counting pulses in said counting base signal during, selected portions of said periods each of which portions is determined in duration both by said periodic timing signal and by a voltage state change in said comparator means output, said counting means providing those counts reached in each of said period portions at an output thereof.

24. The apparatus of claim 23 wherein said signal combining means input which is electrically connected to said analog signal input region, as aforesaid, is so connected thereto through a variable gain amplifier having a signal input electrically connected to said analog signal input region and an output connected to that said input of said integrating means, said variable gain amplifier having a control input which is electrically connected to a gain control signal input region intended to receive gain control signals to select alternative gains to be applied by said variable gain amplifier to signals provided on said signal input thereof with resulting signals being provided at said output thereof.

25. The apparatus of claim 23 wherein said switching means further comprises a calculating means which successively receives those counts reached by said counting means in said period portions and provides a plurality of calculating means digital output signals each as a said digit signal to one of said converter system plurality of signal output regions to thereby form said converter system digital output signals representing time integrals of a ratio of said analog input signal to said reference value signal over selected time periods.

26. The apparatus of claim 23 wherein said switching means further comprises a calculating means which successively receives those counts reached by said counting means in said period portions and provides a plurality of calculating means digital output signals each as a said digit signal to one of said converter system plurality of signal output regions to thereby form said converter system digital output signals representing signal averages of a ratio of said analog input signal to said reference value signal over selected time periods.

* * * * *

UNITED STATES PATENT AND TRADEMARK OFFICE
CERTIFICATE OF CORRECTION

PATENT NO. : 5,097,264
DATED : March 17, 1992
INVENTOR(S) : M.A. Brenner et al.

It is certified that error appears in the above-identified patent and that said Letters Patent is hereby corrected as shown below:

Column 16, line 8, delete "o" and insert --of--

Signed and Sealed this

Twenty-sixth Day of October, 1993

Attest:

BRUCE LEHMAN

Attesting Officer

Commissioner of Patents and Trademarks